United States Patent
Saido

(10) Patent No.: US 9,062,376 B1
(45) Date of Patent: Jun. 23, 2015

(54) SUBSTRATE PROCESSING APPARATUS, METHOD OF MANUFACTURING SEMICONDUCTOR DEVICE AND NON-TRANSITORY COMPUTER READABLE RECORDING MEDIUM

(71) Applicant: Hitachi Kokusai Electric Inc., Tokyo (JP)

(72) Inventor: Shuhei Saido, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 14/502,044

(22) Filed: Sep. 30, 2014

(30) Foreign Application Priority Data

Nov. 29, 2013 (JP) ................................. 2013-248056
Mar. 28, 2014 (JP) ................................. 2014-069339

(51) Int. Cl.
  *C23C 16/46* (2006.01)
  *C23C 16/458* (2006.01)
  *C23C 16/455* (2006.01)
  *H01L 21/02* (2006.01)

(52) U.S. Cl.
  CPC .............. *C23C 16/46* (2013.01); *C23C 16/4586* (2013.01); *C23C 16/45565* (2013.01); *C23C 16/45582* (2013.01); *C23C 16/45523* (2013.01); *H01L 21/02263* (2013.01)

(58) Field of Classification Search
  CPC ............ H01L 21/6719; H01L 21/0206; H01L 21/67011; H01L 21/67098; H01L 21/67184; H01L 21/67196; H01L 21/67201; H01L 21/67207; C23C 16/46; C23C 16/45565; C23C 16/45536; C23C 16/4584; C23C 16/44; C23C 16/4411; C23C 16/4412; C23C 16/4481; C23C 16/45502; C23C 16/45544; C23C 16/45553; C23C 16/45561; C23C 16/45574; C23C 16/45578; C30B 25/08; C30B 25/165; H05B 1/0233; F27B 5/02; F27B 5/04

See application file for complete search history.

(56) References Cited

U.S. PATENT DOCUMENTS 5,968,593 A * 10/1999 Sakamoto et al. .......... 427/248.1
6,218,212 B1 * 4/2001 Saito et al. ....................... 438/93
6,277,442 B1 * 8/2001 Beaumont et al. ........... 427/96.9
6,461,961 B1 * 10/2002 Sano et al. ..................... 438/686

(Continued)

FOREIGN PATENT DOCUMENTS

JP  2002-26112 A  1/2002
JP  2002-155364 A  5/2002

(Continued)

*Primary Examiner* — Evan Pert
*Assistant Examiner* — Gustavo Ramallo
(74) *Attorney, Agent, or Firm* — Volpe and Koenig, P.C.

(57) ABSTRACT

A substrate processing apparatus capable of suppressing generation of by-products in a buffer space in even a single-wafer apparatus using the buffer space, and a method of manufacturing a semiconductor device are provided. The substrate processing apparatus includes a process chamber including a placement unit having a placing surface whereon a substrate is placed, a shower head including a buffer chamber and installed at upstream side of the process chamber, a gas supply system configured to alternately supply at least two types of gases into the process chamber via the buffer chamber of the shower head, and a heating unit configured to heat the buffer chamber to a first temperature and the process chamber to a second temperature which is higher than the first temperature while the at least two types of gases are supplied via the gas supply system.

16 Claims, 13 Drawing Sheets

(56) References Cited

U.S. PATENT DOCUMENTS

| | | | |
|---|---|---|---|
| 6,682,971 B2* | 1/2004 | Tsuneda et al. | 438/240 |
| 7,531,467 B2* | 5/2009 | Sano et al. | 438/785 |
| 7,896,968 B2* | 3/2011 | Hirono et al. | 118/718 |
| 2002/0157692 A1* | 10/2002 | Ishihara et al. | 134/134 |
| 2005/0003600 A1* | 1/2005 | Kasai et al. | 438/200 |
| 2007/0157882 A1* | 7/2007 | Ozaki et al. | 118/715 |
| 2009/0029562 A1* | 1/2009 | Okada et al. | 438/763 |
| 2010/0029065 A1* | 2/2010 | Nagashima et al. | 438/478 |
| 2011/0234100 A1* | 9/2011 | Tomita et al. | 315/111.21 |
| 2011/0275225 A1* | 11/2011 | Kurita | 438/761 |
| 2011/0287635 A1* | 11/2011 | Boguslavskiy et al. | 438/758 |
| 2012/0071002 A1* | 3/2012 | Nakayama | 438/758 |
| 2013/0126906 A1* | 5/2013 | Tomita et al. | 257/77 |
| 2014/0235066 A1* | 8/2014 | Kameda et al. | 438/758 |

FOREIGN PATENT DOCUMENTS

| | | |
|---|---|---|
| JP | 2007-273747 A | 10/2007 |
| JP | 2008-001923 A | 1/2008 |
| JP | 3147392 U | 12/2008 |

* cited by examiner 234b  234a

SUBSTRATE PROCESSING APPARATUS, METHOD OF MANUFACTURING SEMICONDUCTOR DEVICE AND NON-TRANSITORY COMPUTER READABLE RECORDING MEDIUM

CROSS-REFERENCE TO RELATED PATENT APPLICATION

This U.S. non-provisional patent application claims priority under 35 U.S.C. §119 of Japanese Patent Application No. 2013-248056 filed on Nov. 29, 2013 and Japanese Patent Application No. 2014-069339 filed on Mar. 28, 2014, in the Japanese Patent Office, the entire contents of which are hereby incorporated by reference.

BACKGROUND OF THE INVENTION

1. Field of the Invention

The present invention relates to a substrate processing apparatus and a method of manufacturing a semiconductor device.

2. Description of the Related Art

Recently, there has been a tendency to manufacture semiconductor devices such as flash memories in a highly integrated manner. Thus, pattern sizes of semiconductor devices are becoming finer and finer. To form such a fine pattern, a predetermined treatment process, such as an oxidation process or a nitridation process, may be performed on a substrate as a process included in a semiconductor device manufacturing process.

As one method of forming such a pattern, there is a process of forming a groove between circuits and forming a liner film or wires in the groove. Such grooves are being configured to have higher aspect ratios as pattern sizes become finer and finer.

To form the liner film and the like, it is required to form a film having high step coverage so that the film has a uniform film thickness on an upper side surface, a middle side surface, a lower side surface and a bottom portion of the groove. By forming the film having high step coverage, a semiconductor device may have uniform characteristics between grooves, thereby suppressing a deviation in the characteristics of the semiconductor device.

There have been attempts to process a groove having a high aspect ratio by heating a gas or converting the gas into a plasma state, but a film having high step coverage is difficult to form.

As a method of forming such a film, an alternate supply method of alternately supplying at least two types of process gases and reacting the supplied gases together to form a film has been introduced. In the alternate supply method, a source gas and a reactive gas are reacted on a surface of a substrate, but a purging process is preferably performed between gas supply processes to remove remnant gases while the gases are supplied so that the source gas and the reactive gas may not react with each other on locations other than the surface of the substrate.

Since the characteristics of a semiconductor device on a surface of a substrate need to be uniformized to improve the product yield of the semiconductor device, a gas is evenly supplied within a plane of the substrate when a thin film is formed. To this end, a single-wafer apparatus capable of evenly supplying a gas onto a surface of the substrate to be processed has been developed. In the single-wafer apparatus, for example, a shower head with a buffer space is installed on the substrate to supply a gas onto the substrate more evenly.

SUMMARY OF THE INVENTION

When a film is formed using the single-wafer apparatus, at least two types of gases are reacted with each other above or on a surface of a substrate to form the film. However, in the case of the single-wafer apparatus, since the two types of gases are supplied via a buffer space, remnant gases may react with each other to generate by-products in the buffer space. The features of the substrate may be badly influenced by the by-products. Also, the productivity is low since the number of processes to be performed is large in this case.

Thus, it is an object of the present invention to provide a substrate processing apparatus capable of forming a film with high productivity and characteristics and a method of manufacturing a semiconductor device.

According to one aspect of the present invention, there is provided a substrate processing apparatus including a process chamber including a placement unit having a placing surface whereon a substrate is placed; a shower head including a buffer chamber and installed at upstream side of the process chamber; a gas supply system configured to alternately supply at least two types of gases into the process chamber via the buffer chamber of the shower head; and a heating unit configured to heat the buffer chamber to a first temperature and the process chamber to a second temperature which is higher than the first temperature while the at least two types of gases are supplied via the gas supply system.

According to another aspect of the present invention, there is provided a method of manufacturing a semiconductor device, the method including placing a substrate on a placing surface of a placement unit accommodated in a process chamber; and forming a film on the substrate by alternately supplying at least two types of gases into the process chamber via a shower head while heating a buffer chamber of the shower head to a first temperature and the process chamber to a second temperature which is higher than the first temperature.

DETAILED DESCRIPTION OF THE PREFERRED EMBODIMENTS

First Embodiment of the Present Invention

Figure 2:
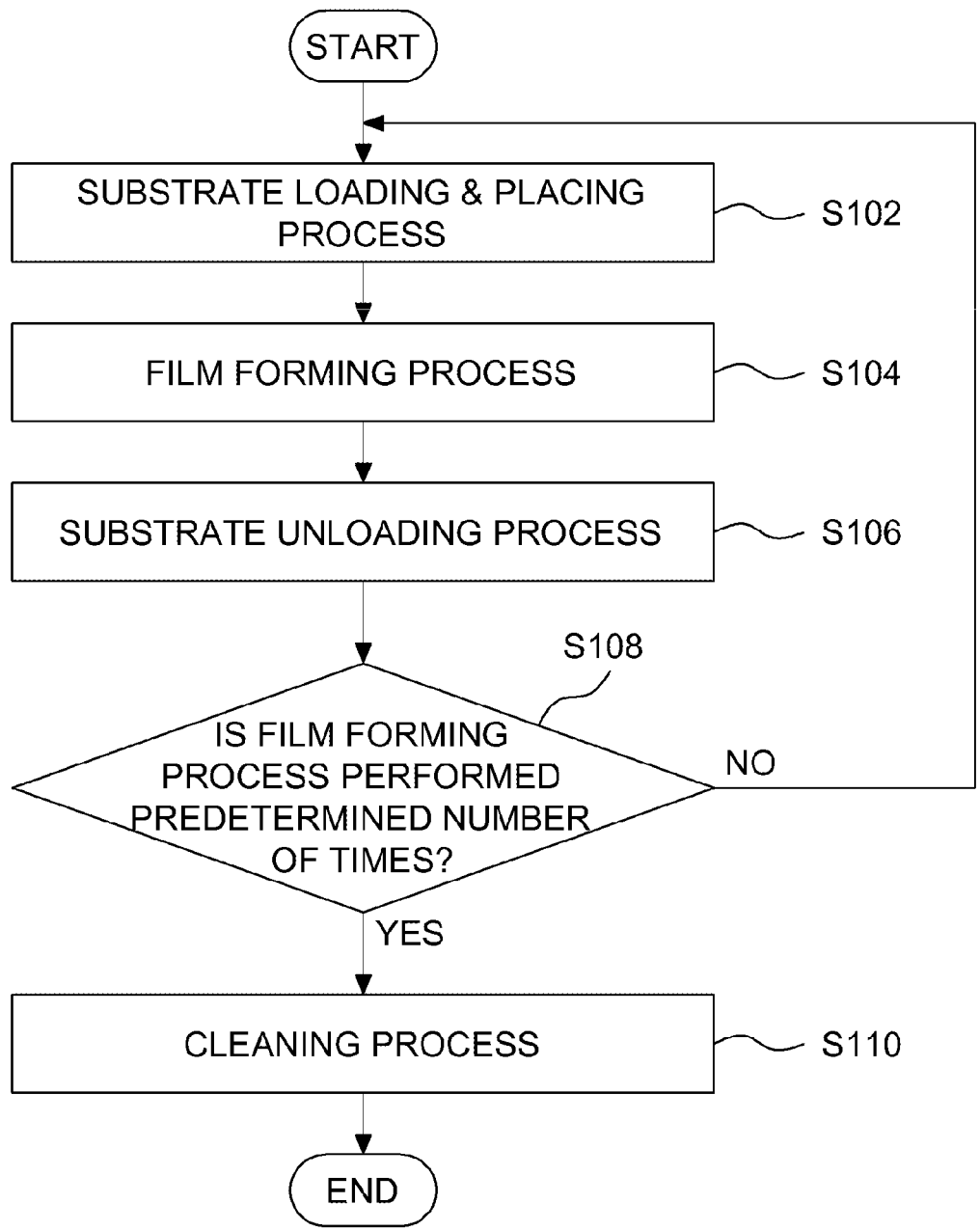
FIG. 2 is a flowchart of a substrate processing process according to an embodiment of the present invention.
Figure 3:
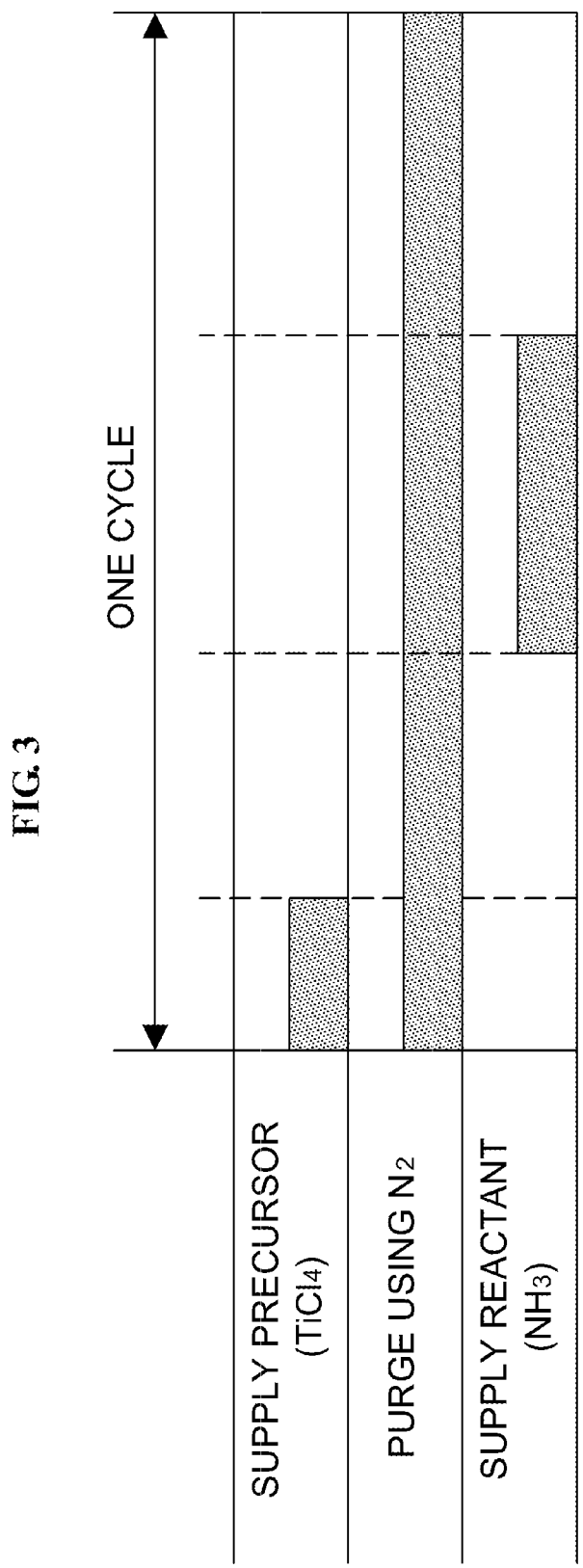
FIG. 3 is a diagram illustrating gas supply timing in a film forming process according to an embodiment of the present invention.

A substrate processing apparatus according to a first embodiment of the present invention will be described with reference to FIGS. 1 to 3 below.

(1) Structure of Substrate Processing Apparatus

Figure 1:
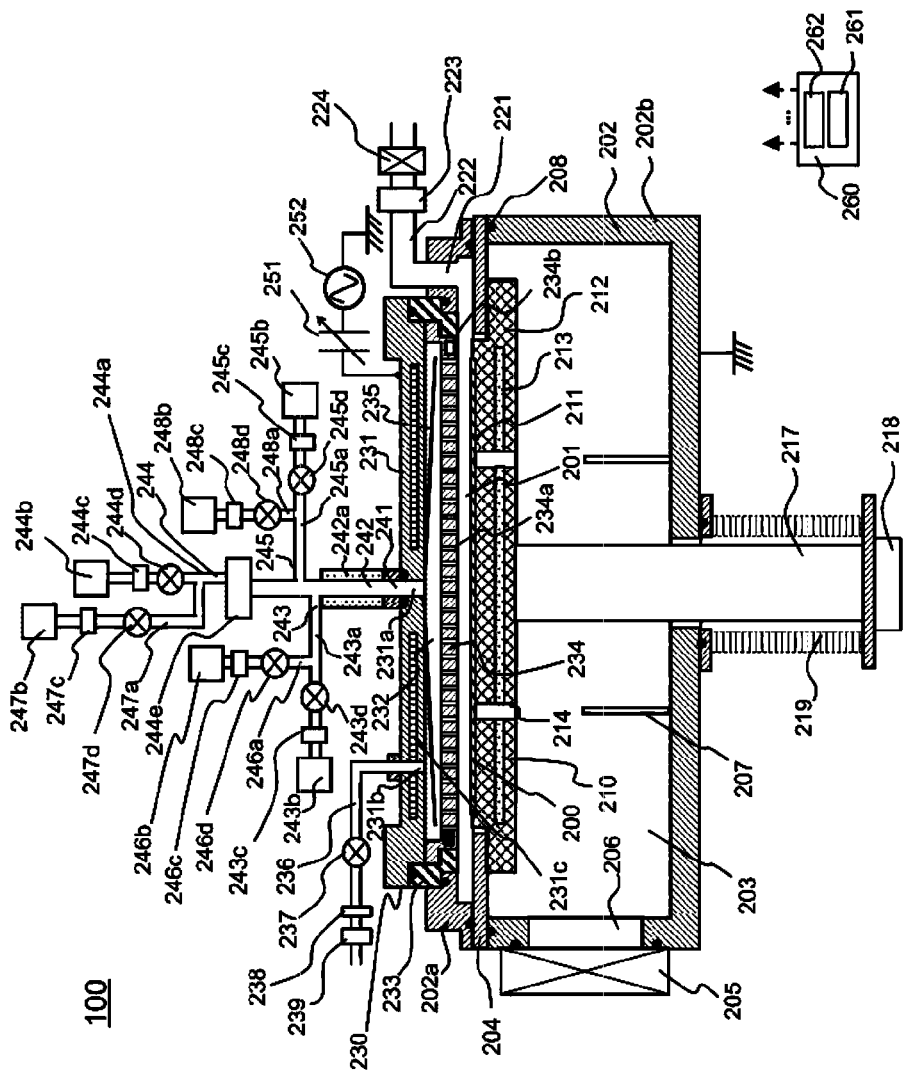
FIG. 1 is a cross-sectional view of a substrate processing apparatus according to an embodiment of the present invention.

FIG. 1 is a cross-sectional view of a substrate processing apparatus 100 according to the first embodiment.

The substrate processing apparatus 100 is an apparatus capable of forming a thin film and configured as a single-wafer type substrate processing apparatus as illustrated in FIG. 1.

As illustrated in FIG. 1, the substrate processing apparatus 100 includes a process container 202. The process container 202 is configured, for example, as a flat airtight container having a circular cross-section. Also, sidewalls or a lower wall of the process container 202 is formed of a metal material, e.g., aluminum (Al) or stainless steel (steel-use-stainless (SUS)). In the process container 202, a process chamber 201 configured to process a wafer 200, e.g., a silicon wafer, as a substrate and a transfer space 203 are formed. The process container 202 includes an upper container 202a, a lower container 202b and a shower head 230 which is a ceiling portion. A partition plate 204 is installed between the upper container 202a and the lower container 202b. A space surrounded by the upper container 202a and the shower head 230 and located above the partition plate 204 will hereinafter be referred to as a 'process chamber space' and a space surrounded by the lower container 202b and located below the partition plate 204 will hereinafter be referred to as a 'transfer space.' A structure including the upper container 202a and the shower head 230 and surrounding a process space will hereinafter be referred to as the process chamber 201. A structure surrounding the transfer space will hereinafter be referred to as the transfer space 203 included in the process chamber 201. An O-ring 208 is installed between the structures to air-tightly close the inside of the process container 202.

At a side of the lower container 202b, a substrate loading exit 206 is installed adjacent to a gate valve 205 and the wafer 200 is moved between transfer chambers (not shown) via the substrate loading exit 206. A plurality of lift pins 207 are installed on a bottom portion of the lower container 202b. The lower container 202b is grounded.

In the process chamber 201, a substrate support 210 (which may also be referred to as a substrate placement unit 210) configured to support the wafer 200 is present. The substrate support 210 mainly includes a substrate placing surface 211 on which the wafer 200 is placed, a substrate placing table 212 with the substrate placing surface 211 and a substrate placing table heating unit 213 (which may also be referred to as a first heating unit 213) included in substrate placing table 212 and serving as a heating source for heating the wafer 200. In the substrate placing table 212, through-holes 214 through which the lift pins 207 pass are installed in locations corresponding to the lift pins 207.

The substrate placing table 212 is supported by a shaft 217. The shaft 217 passes through a bottom portion of the process container 202 and is connected to a lifting mechanism 218 outside the process container 202. By lifting the shaft 217 and the substrate placing table 212 by operating the lifting mechanism 218, the wafer 200 placed on the substrate placing surface 211 may be moved upward. Also, the circumference of a lower end portion of the shaft 217 is covered with a bellows 219 and the inside of the process container 202 is maintained in an air tight state.

The substrate placing table 212 is moved downward to the substrate support 210 to move the substrate placing surface 211 to the substrate loading exit 206 (i.e., a wafer transfer position) so as to transfer the wafer 200, and the wafer 200 is moved upward to a process position (i.e., a wafer process position) in the process chamber 201 so as to process the wafer 200 as illustrated in FIG. 1.

In detail, when the substrate placing table 212 is moved downward to the wafer transfer position, upper end portions of the lift pins 207 protrude from an upper surface of the substrate placing surface 211 to support the wafer 200 with the lift pins 207 from below. When the substrate placing table 212 is moved upward to the wafer process position, the lift pins 207 are buried in the upper surface of the substrate placing surface 211 so that the wafer 200 may be supported by the substrate placing surface 211 from below. Also, the lift pins 207 directly contact the wafer 200 and are thus preferably formed of, for example, quartz or alumina.

(Gas Introduction Hole)

In an upper surface (a ceiling wall) of the shower head 230 (which will be described in detail below) installed above the process chamber 201, a gas introduction hole 241 is formed to supply various gases into the process chamber 201. The structure of a gas supply system connected to the gas introduction hole 241 will be described below.

(Shower Head)

The shower head 230 serving as a gas dispersion mechanism that communicates with the process chamber 201 is installed between the gas introduction hole 241 and the process chamber 201. That is, the shower head 230 is installed at upstream side of the process chamber 201. The gas introduction hole 241 is connected to a lid 231 of the shower head 230. A gas introduced via the gas introduction hole 241 is supplied into the buffer space in a buffer chamber 232 of the shower head 230 via a hole 231a formed in the lid 231. That is, the lid 231 is installed at upstream in a gas supply direction viewed from the buffer chamber 232. The buffer chamber 232 is formed on a lower end portion of the lid 231 and the top of a dispersion plate 234 which will be described below. That is, the dispersion plate 234 is installed at downstream (here, toward the process chamber 201) in the gas supply direction viewed from the buffer chamber 232.

The lid 231 of the shower head is formed of a metal having conductive/thermally conductive properties and is used as an electrode to generate plasma in the buffer space in the buffer chamber 232 or in the process chamber 201. An insulating block 233 is installed between the lid 231 and the upper container 202a and insulates between the lid 231 and the upper container 202a. Also, a lid heating unit 231c (which may also be referred to as a 'second heating unit') is installed at the lid 231 of the shower head and heats an inner atmosphere of the buffer chamber 232 or a gas guide 235 which will be described below.

The shower head 230 includes the dispersion plate 234 between a space in the buffer chamber 232 and a process space in the process chamber 201 to disperse a gas introduced via the gas introduction hole 241. A plurality of through-holes 234a are installed in the dispersion plate 234. The dispersion plate 234 is disposed opposite the substrate placing surface 211. The gas dispersion plate 234 includes a convex part having the through-holes 234a and a flange part installed around the convex part. The flange part is supported by the insulating block 233. Also, a dispersion plate heating unit 234b having a cylindrical shape (which may also be referred to as a 'third heating unit') is disposed around the through-holes 234a. The dispersion plate heating unit 234b heats the dispersion plate 234 to influence the temperature of the inner atmosphere of the buffer chamber 232 or an inner atmosphere of the process chamber 201.

Since a space in the process chamber 201 is between the dispersion plate 234 and a substrate, the wafer 200 is indirectly heated by radiation from the dispersion plate 234. Also, since the wafer 200 is placed on the substrate placing table 212, the substrate placing table heating unit 213 directly heats the wafer 200 by conduction. Thus, when the wafer 200 is heated, heating by the substrate placing table heating unit 213 is more dominant than heating by the dispersion plate heating unit 234b. Thus, when the temperature of the wafer 200 is controlled, the substrate placing table heating unit 213 is first controlled.

In the buffer chamber 232, a gas guide 235 is installed to form the flow of a supplied gas. The gas guide 235 has a conical shape, the peak point of which is the hole 231a and the diameter of which increases in a direction of the dispersion plate 234. A horizontal diameter of a lower end of the gas guide 235 is formed to exceed an outermost circumferential portion of a group of the plurality of through-holes 234a. The gas guide 235 is heated by the lid heating unit 231c by being connected to the lid 231, and heats the inner atmosphere of the buffer chamber 232.

An exhaust pipe 236 is connected to an upper portion of the buffer chamber 232 via an exhaust hole 231b for the shower head 230. A valve 237 configured to switch exhaust on/off, a pressure adjustor 238, such as an auto pressure controller (APC), configured to control the inside of the buffer chamber 232 to have a predetermined pressure and a vacuum pump 239 are sequentially connected in series to the exhaust pipe 236.

Since the exhaust hole 231b is above the gas guide 235, a gas flows in a shower head exhaust process (which will be described below) as will be described below. An inert gas supplied via the hole 231a is dispersed by the gas guide 235 and flows to the center of or below the space in the buffer chamber 232. Then, the inert gas circles around an end portion of the gas guide 235 and is then exhausted via the exhaust hole 231b. The exhaust pipe 236, the valve 237 and the pressure adjustor 238 will be referred to together as a first exhaust system.

(Supply System)

A common gas supply pipe 242 is connected to the gas introduction hole 241 connected to the lid 231 of the shower head 230. A common gas supply pipe heater 242a (which may also be referred to as a 'fourth heating unit') is installed at the common gas supply pipe 242 to heat the common gas supply pipe 242, and configured to heat a gas passing through an inner side of the common gas supply pipe 242. A gas may be heated to a temperature whereat a reaction inhibitor which is a by-product does not adhere by heating the gas beforehand by the common gas supply pipe heater 242a before the gas is supplied into the buffer chamber 232. A first gas supply pipe 243a, a second gas supply pipe 244a and a third gas supply pipe 245a are connected to the common gas supply pipe 242. The second gas supply pipe 244a is connected to the common gas supply pipe 242 via a remote plasma unit 244e.

A first-element-containing gas is mainly supplied via a first gas supply system 243 including the first gas supply pipe 243a and a second-element-containing gas is mainly supplied via a second gas supply system 244 including the second gas supply pipe 244a. An inert gas is mainly supplied when the wafer 200 is processed using a third gas supply system 245 including the third gas supply pipe 245a and a cleaning gas is mainly supplied when the process chamber 201 is cleaned.

(First Gas Supply System)

At the first gas supply pipe 243a, a first gas source 243b, a mass flow controller (MFC) 243c which is a flow rate controller (flow rate control unit) and a valve 243d which is an opening/closing valve are sequentially installed from an upstream end.

A gas containing a first element (hereinafter referred to as the 'first-element-containing gas') is supplied into the shower head 230 via the MFC 243c, the valve 243d and the common gas supply pipe 242.

The first-element-containing gas is a source gas, i.e., one of process gases. Here, the first element is, for example, titanium (Ti). That is, the first-element-containing gas is, for example, a titanium-containing gas. For example, $TiCl_4$ gas may be used as the titanium-containing gas. Also, the first-element-containing gas may have a solid, liquid, or gaseous state at normal temperature and pressure. When the first-element-containing gas has a liquid state at normal temperature and pressure, a vaporizer (not shown) may be installed between the first gas source 243b and the MFC 243c. Here, it is assumed that the first-element-containing gas is in a gaseous state.

Also, a silicon-containing gas may be used. For example, organic silicon materials such as hexamethyldisilazane ($C_6H_{19}NSi_2$, abbreviated as 'HMDS'), trisilylamine [$(SiH_3)_3N$, abbreviated as 'TSA'], bis-tertiary butyl aminosilane ($SiH_2[NH(C_4H_9)]_2$, abbreviated as 'BTBAS') gas, or the like may be used as the silicon-containing gas. These gases act as precursors.

A downstream end of a first inert gas supply pipe 246a is connected to the first gas supply pipe 243a downstream side of the valve 243d. An inert gas source 246b, an MFC 246c which is a flow rate controller (flow rate control unit) and a valve 246d which is an opening/closing valve are sequentially installed at the first inert gas supply pipe 246a from the upstream end.

Here, an inert gas is, for example, nitrogen ($N_2$) gas. In addition to the $N_2$ gas, for example, a rare gas such as helium (He) gas, neon (Ne) gas, or argon (Ar) gas may be used as the inert gas.

The inert gas is supplied into the shower head 230 from the first inert gas supply pipe 246a via the MFC 246c, the valve 246d and the first gas supply pipe 243a. The inert gas acts as a carrier gas or a dilution gas in a thin film forming process (operation S104) which will be described below.

The first-element-containing gas supply system 243 (which may also be referred to as a titanium-containing gas supply system) mainly includes the first gas supply pipe 243a, the MFC 243c and the valve 243d.

A first inert gas supply system mainly includes the first inert gas supply pipe 246a, the MFC 246c and the valve 246d. The first inert gas supply system may further include the inert gas source 246b and the first gas supply pipe 243a.

The first-element-containing gas supply system 243 may further include the first gas source 243b and the first inert gas supply system.

(Second Gas Supply System)

The remote plasma unit 244e is installed at downstream side of the second gas supply pipe 244a. A second gas source 244b, an MFC 244c which is a flow rate controller (flow rate control unit) and a valve 244d which is an opening/closing valve are sequentially installed at the second gas supply pipe 244a from the upstream end.

A gas containing a second element (hereinafter referred to as the 'second-element-containing gas') is supplied into the shower head 230 from the second gas supply pipe 244a via the MFC 244c, the valve 244d, the remote plasma unit 244e and the common gas supply pipe 242. The second-element-containing gas is changed into a plasma state by the remote plasma unit 244e and is radiated onto the wafer 200.

The second-element-containing gas is one of the process gases. Also, the second-element-containing gas may be considered as a reactive gas or a modifying gas.

Here, the second-element-containing gas contains the second element that is different from the first element. The second element is, for example, oxygen (O), nitrogen (N), or carbon (C). In the present embodiment, it is assumed that the second-element-containing gas is, for example, a nitrogen-containing gas. In detail, ammonia ($NH_3$) gas is used as the nitrogen-containing gas.

The second-element-containing gas supply system 244 (which may also be referred to as a nitrogen-containing gas supply system) mainly includes the second gas supply pipe 244a, the MFC 244c and the valve 244d.

A downstream end of a second inert gas supply pipe 247a is connected to the second gas supply pipe 244a downstream side of the valve 244d. An inert gas source 247b, an MFC 247c which is a flow rate controller (flow rate control unit) and a valve 247d which is an opening/closing valve are sequentially installed at the second inert gas supply pipe 247a from the upstream end.

An inert gas is supplied into the shower head 230 from the second inert gas supply pipe 247a via the MFC 247c, the valve 247d and the second gas supply pipe 244a. The inert gas acts as a carrier gas or a dilution gas in the film forming process (which may also be referred to as the 'thin film forming process') (operation S104) which will be described below.

A second inert gas supply system mainly includes the second inert gas supply pipe 247a, the MFC 247c and the valve 247d. The second inert gas supply system may further include the inert gas source 247b, the second gas supply pipe 244a and the remote plasma unit 244e.

The second-element-containing gas supply system 244 may further include the second gas source 244b, the remote plasma unit 244e and the second inert gas supply system.

(Third Gas Supply System)

A third gas source 245b, an MFC 245c which is a flow rate controller (flow rate control unit) and a valve 245d which is an opening/closing valve are sequentially installed at the third gas supply pipe 245a from the upstream end.

An inert gas is supplied as a purge gas to the shower head 230 from the third gas supply pipe 245a via the MFC 245c, the valve 245d and the common gas supply pipe 242.

Here, the inert gas is, for example, nitrogen ($N_2$) gas. In addition to the $N_2$ gas, for example, a rare gas such as helium (He) gas, neon (Ne) gas or argon (Ar) gas may be used as the inert gas.

A downstream end of the cleaning gas supply pipe 248a is connected to the third gas supply pipe 245a downstream side of the valve 245d. A cleaning gas source 248b, an MFC 246c which is a flow rate controller (flow rate control unit) and a valve 246d which is an opening/closing valve are sequentially installed at the cleaning gas supply pipe 248a from the upstream end.

The third gas supply system 245 mainly includes the third gas supply pipe 245a, the MFC 245c and the valve 245d.

Also, a cleaning gas supply system mainly includes the cleaning gas supply pipe 248a, the MFC 248c and the valve 248d. The cleaning gas supply system may further include the cleaning gas source 248b and the third gas supply pipe 245a.

Also, the third gas supply system 245 may further include the third gas source 245b and the cleaning gas supply system.

An inert gas is supplied into the shower head 230 from the third gas supply pipe 245a via the MFC 245c, the valve 245d and the common gas supply pipe 242. Also, a cleaning gas is supplied into the shower head 230 via the MFC 248c, the valve 248d and the common gas supply pipe 242.

The inert gas supplied from the inert gas source 245b acts as a purge gas for purging a gas remaining in the process chamber 201 or the shower head 230 in the thin film forming process (operation S104) which will be described below. Also, in the cleaning process, the inert gas may act as a carrier gas or a dilution gas of the cleaning gas.

The cleaning gas supplied from the cleaning gas source 248b acts as a cleaning gas for removing by-products and the like attached to the shower head 230 or the process chamber 201.

Here, the cleaning gas is, for example, nitrogen trifluoride ($NF_3$). Also, for example, hydrofluoric acid (HF) gas, chlorine trifluoride ($ClF_3$) gas, fluorine ($F_2$) gas, or a combination thereof may be used as the cleaning gas.

(Second Exhaust System)

An exhaust port 221 is installed on a side surface of an inner wall of the process chamber 201 (particularly, the upper container 202a) to exhaust an inner atmosphere of the process chamber 201. An exhaust pipe 222 is connected to the exhaust port 221. A pressure adjustor 223, such as an APC, configured to control the inside of the process chamber 201 to have a predetermined pressure and a vacuum pump 224 are sequentially connected in series to the exhaust pipe 222. A second exhaust system (exhaust line) mainly includes the exhaust port 221, the exhaust pipe 222, the pressure adjustor 223 and the vacuum pump 224.

(Plasma Generation Unit)

A matching device 251 and a high-frequency power source 252 are connected to the lid 231 of the shower head 230. Plasma is generated in the shower head 230 and the process chamber 201 by adjusting impedance by the high-frequency power source 252 and the matching device 251.

(Controller)

The substrate processing apparatus 100 includes a controller 260 configured to control operations of various elements of the substrate processing apparatus 100. The controller 260 includes at least an operation unit 261 and a memory unit 262. The controller 260 calls a substrate processing apparatus program or a control recipe from the memory unit 262 according to a command received therefrom or a user, and controls various elements of the substrate processing apparatus 100 according to this program or the control recipe. Such programs are recorded on a recording medium such as a hard disk or a flash memory.

(2) Substrate Processing Process

A process of forming a thin film on the wafer 200 using the substrate processing apparatus 100 will now be described with reference to FIGS. 2 to 5. In the following description, the operations of various elements of the substrate processing apparatus 100 are controlled by the controller 260.

Figure 4:
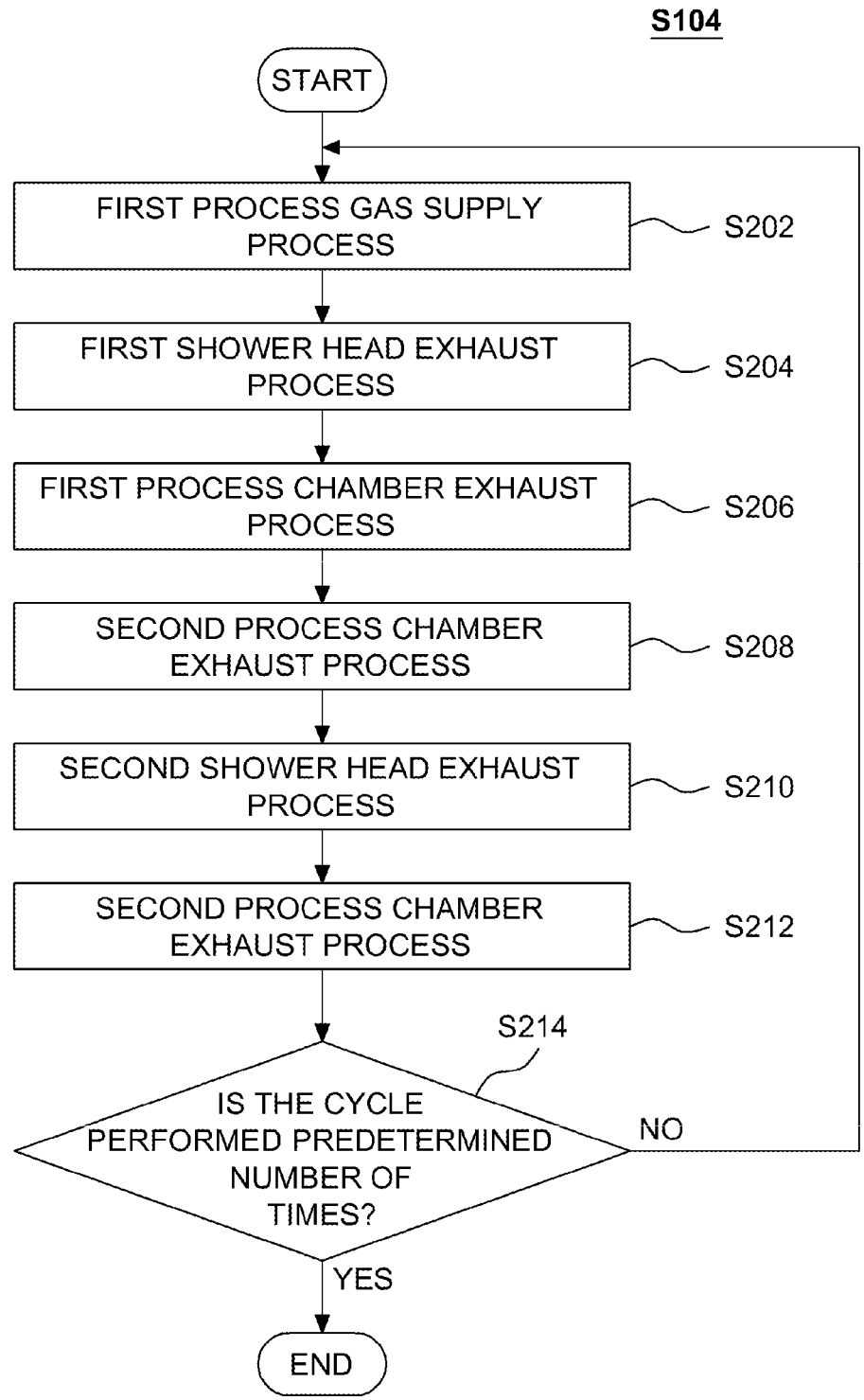
FIG. 4 is a flowchart of a film forming process according to an embodiment of the present invention.
Figure 5:
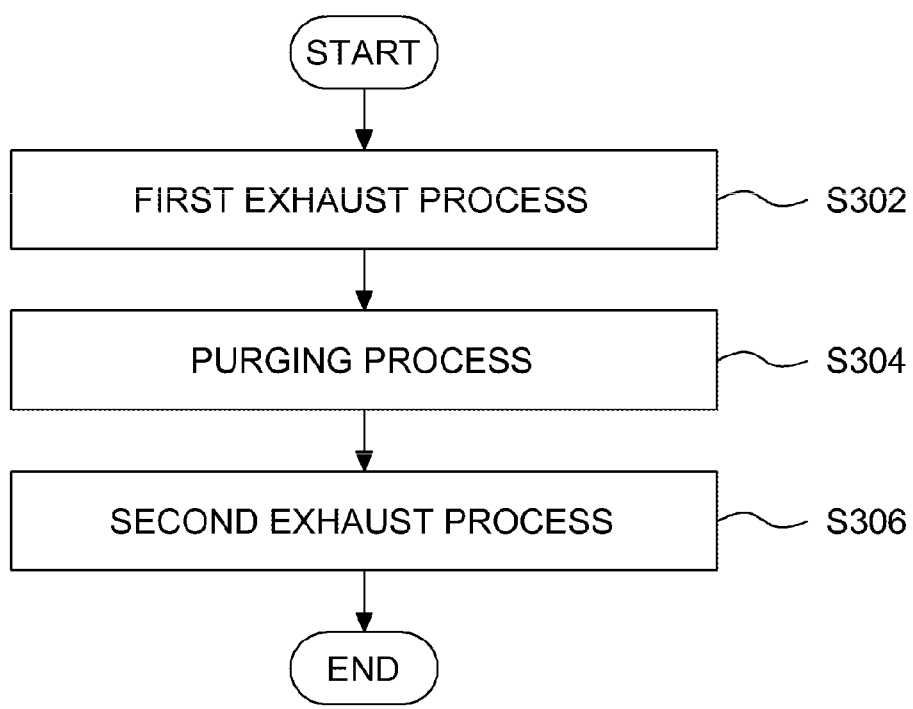
FIG. 5 is a flowchart of a shower head exhaust process according to an embodiment of the present invention.

A substrate processing process will be briefly described with reference to FIGS. 2 to 5 below. FIG. 2 is a flowchart of a substrate processing process according to the present embodiment. FIG. 3 is a diagram illustrating gas supply timing in a film forming process according to an embodiment of the present invention. FIG. 4 is a detailed flowchart of the film forming process. FIG. 5 is a detailed flowchart of a shower head exhaust process according to an embodiment of the present invention.

Here, a case in which a titanium nitride (TiN) film is formed as a thin film on the wafer 200 using $TiCl_4$ gas as a first-element-containing gas and ammonia ($NH_3$) gas as a second-element-containing gas will be described. Also, for example, a predetermined film may be formed on the wafer 200 beforehand. Also, a predetermined pattern may be formed on the wafer 200 or the predetermined film.

[Substrate loading and placing process (operation S102)]

In the substrate processing apparatus 100, the substrate placing table 212 is moved downward to the wafer transfer position to cause the lift pins 207 to pass through the through-holes 214 of the substrate placing table 212. As a result, the lift pins 207 protrude by a predetermined height from a surface of the substrate placing table 212. Then, the gate valve 205 is opened, and the wafer 200 (a substrate to be processed) is loaded into the process chamber 201 using a wafer transfer machine (not shown) and transferred on the lift pins 207. Thus, the wafer 200 is supported in a horizontal posture on the lift pins 207 protruding from the surface of the substrate placing table 212.

When the wafer 200 is loaded into the process container 202, the wafer transfer machine is withdrawn to the outside of the process container 202, the gate valve 205 is closed, and the inside of the process container 202 is air-tightly closed. Then, the wafer 200 is placed on the substrate placing surface 211 of the substrate placing table 212 by moving the substrate placing table 212 upward.

Also, when the wafer 200 is loaded into the process container 202, $N_2$ gas is preferably supplied as an inert gas from the inert gas supply system into the process container 202 while the inside of the process container 202 is exhausted using the exhaust system. That is, the $N_2$ gas is preferably supplied into the process container 202 by opening at least the valve 245d of the third gas supply system in a state in which the inside of the process container 202 is exhausted by operating the vacuum pump 224 to open the APC valve 223. Thus, particles may be suppressed from penetrating into the process container 202 or from being attached to the wafer 200. The vacuum pump 224 is constantly operated at least until the substrate loading and placing process (operation S102) to a substrate unloading process (operation S106) which will be described below end.

When the wafer 200 is placed on the substrate placing table 212, power is supplied to the substrate placing table heating unit 213 embedded in the substrate placing table 212 and/or the dispersion plate heating unit 234b so as to control a surface of the wafer 200 to have a predetermined temperature. The temperature of the wafer 200 is, for example, in a range of room temperature to 500° C. or less, and preferably, a range of room temperature to 400° C. or less. In this case, the temperature of the substrate placing table heating unit 213 is adjusted by controlling the amount of electric power to be supplied to the first heating unit 213 based on temperature information detected by a temperature sensor (not shown).

[Film Forming Process (Operation S104)]

Next, the film forming process (operation S104) is performed. A basic flow of the film forming process (operation S104) and the details of the present embodiment will be described below.

In the film forming process (operation S104), $TiCl_4$ gas is supplied into the process chamber 201 via the buffer chamber 232 of the shower head 230. The supply of the $TiCl_4$ gas is suspended a predetermined time after the $TiCl_4$ gas is supplied, and the $TiCl_4$ gas is discharged from the buffer chamber 232 and the process chamber 201 using a purge gas.

After the $TiCl_4$ gas is discharged, ammonia gas that is in a plasma state is supplied into the process chamber 201 via the buffer chamber 232. The ammonia gas reacts with a titanium containing film formed on the wafer 200 to form a titanium nitride film. After a predetermined time passes, the supply of the ammonia gas is stopped and the ammonia gas is discharged from the shower head 230 and the process chamber 201 using a purge gas.

In the film forming process (operation S104), a titanium nitride film is formed to a desired thickness by repeatedly performing the flow of this process described above.

[Substrate unloading process (operation S106)]

Next, the substrate placing table 212 is moved downward to support the wafer 200 on the lift pins 207 protruding from the surface of the substrate placing table 212. Then, the gate valve 205 is opened, and the wafer 200 is unloaded to the outside of the process container 202 using the wafer transfer machine. Then, in order to end the substrate processing process, the supply of the inert gas into the process container from the third gas supply system is stopped.

[Process of Determining a Number of Times of Performing the Film Forming Process (Operation S108)]

After the wafer 200 is unloaded, it is determined whether the number of times of performing the film forming process reaches a predetermined number of times. When it is determined that the number of times of performing the film forming process reaches the predetermined number of times, a cleaning process is performed. When it is determined that the number of times of performing the film forming process (operation S104) does not reach the predetermined number of times, the substrate loading and placing process (operation S102) is performed.

[Cleaning process (operation S110)]

In the process of determining the number of times of performing the film forming process (operation S108), when it is determined that the number of times of performing the film forming process reaches the predetermined number of times, the cleaning process is performed. Here, the valve 248d of the cleaning gas supply system is opened, and a cleaning gas is supplied into the process chamber 201 via the shower head 230.

When the shower head 230 and the process chamber 201 are filled with the cleaning gas, plasma of the cleaning gas is generated in the shower head 230 and the process chamber 201 by performing impedance adjustment using the matching unit 251 while supplying power to the high-frequency power source 252. The generated plasma of the cleaning gas removes by-products attached to the inner walls of the shower head 230 and the process chamber 201.

Next, the film forming process (operation S104) will be described in detail with reference to FIG. 4 below.

[First Process Gas Supply Process (Operation S202)]

The first process gas supply process (operation S202)] begins in a state in which the lid heating unit 231c, the dispersion plate heating unit 234b and the substrate placing table heating unit 213, which are heating units according to the present embodiment, are 'on.' Specifically, an inner atmosphere of the buffer chamber 232 is heated by the lid heating unit 231c, the dispersion plate 234 (including a surface of the dispersion plate 234 opposite to the wafer 200, and the plurality of through-holes 234a) and the wafer 200 are heated by the dispersion plate heating unit 234b, and the wafer 200 on the substrate placing surface 211 is heated by the substrate placing table heating unit 213.

In this case, the temperature of the inner atmosphere of the buffer chamber 232 is controlled to be lower than the temperature of the wafer 200 by using the heating units (the lid heating unit 231c, the dispersion plate heating unit 234b and the substrate placing table heating unit 213) together. More preferably, the temperature of the wafer 200 is controlled to be equal to or greater than a temperature whereat a film can be formed, e.g., a temperature whereat supplied gases react with each other, and a temperature in the buffer chamber 232 is controlled to be equal to a temperature whereat a gas does not react. Also, the temperature in the buffer chamber 232 is preferably set to be equal to or greater than a temperature whereat by-products are not attached to the buffer chamber 232.

More specifically, the lid heating unit 231c and the dispersion plate heating unit 234b are controlled to control a temperature in the buffer space in the buffer chamber 232. In this case, the temperature in the buffer space in the buffer chamber 232 is controlled to be equal to or greater than a temperature whereat a by-product is not attached to side surfaces of the gas guide 235 or the dispersion plate 234 of the buffer chamber 232, to be less than a temperature whereat a supplied gas is attached to inner walls of the buffer chamber 232 or the gas guide 235, to be less than a temperature whereat a supplied gas is pyrolyzed, or to be less than a reaction temperature whereat at least two types of gases supplied react with each other to form a film. Here, the by-product is, for example, salt-ammoniac ($NH_4Cl$) generated when $TiCl_4$ and $NH_3$ remaining in the buffer chamber 232 react with each other. Since salt-ammoniac ($NH_4Cl$) is attached at about 150° C. to 160° C., the temperature in the buffer space in the buffer chamber 232 is controlled using the gas guide 235 and the dispersion plate heating unit 234b to be greater than 160° C., at which salt-ammoniac ($NH_4Cl$) is not attached, so as to suppress salt-ammoniac ($NH_4Cl$) from being attached. Also, the temperature in the buffer space in the buffer chamber 232 is controlled to be equal to a temperature whereat neither of the supplied $TiCl_4$ and $NH_3$ nor a reactant thereof is attached. For example, since a temperature whereat a film is formed by reacting $TiCl_4$ and $NH_3$ with each other ranges from 310° C. to 450° C., the temperature in the buffer space in the buffer chamber 232 is controlled to be less than 310° C. to 450° C. Here, the temperature of the buffer space will be referred to as a 'first temperature.'

Next, the dispersion plate heating unit 234b and the substrate placing table heating unit 213 are controlled to control a temperature of the wafer 200. In this case, the temperature of the wafer 200 and the temperature of the process chamber 201 are controlled to be equal to a temperature whereat film forming is accelerated, i.e., a temperature whereat gases react with each other. The temperature whereat film forming is accelerated means a temperature whereat at least two types of gases react with each other on the wafer 200 or a temperature whereat a supplied gas is attached onto the wafer 200. Here, the temperature of the process chamber 201 will be referred to as a 'second temperature.'

Since the temperature of the process chamber 201 (the temperature of the wafer 200) is controlled to be higher than the temperature of the buffer chamber 232, a relative relation between the lid heating unit 231c and the substrate placing table heating unit 213 is preferably set to satisfy a relation: temperature of the lid heating unit 231c<temperature of the substrate placing table heating unit 213. In other words, the relative relation between the lid heating unit 231c and the substrate placing table heating unit 213 may be set to satisfy a relation: temperature of a space in the buffer chamber 232<temperature in the process chamber 201.

When each of the temperature of the wafer 200 and the temperature of the process chamber 201 reaches a desired temperature, the valve 243d is opened and $TiCl_4$ gas starts to be supplied as a first process gas into the process chamber 201 via the gas introduction hole 241, the buffer chamber 232 and the plurality of through-holes 234a. Together with the supply of $TiCl_4$ gas, the valve 245d is opened and a purge gas starts to be supplied as a third process gas into the process chamber 201 via the gas introduction hole 241, the buffer chamber 232 and the plurality of through-holes 234a. The $TiCl_4$ gas is evenly diffused in the gas buffer chamber 232 by the gas guide 235. The evenly diffused $TiCl_4$ gas is evenly supplied onto the wafer 200 in the process chamber 201 via the plurality of through-holes 234a.

In the buffer chamber 232, the temperature of the supplied first process gas is controlled such that the supplied first process gas is not attached to walls of the buffer chamber 232, thereby suppressing the first process gas from remaining in the buffer chamber 232.

In this case, the flow rate of the $TiCl_4$ gas serving as the first process gas is adjusted to be equal to a predetermined flow rate through the MFC 243c. Also, the flow rate of the inert gas serving as the third process gas is adjusted to be a predetermined flow rate through the MFC 245c. For example, the supply flow rate of the $TiCl_4$ gas is in the range of 100 sccm to 5,000 sccm. Also, $N_2$ gas may be supplied as a carrier gas together with the $TiCl_4$ gas through the first inert gas supply system. Also, the exhaust pump 224 is operated to appropriately adjust the degree of openness of the APC valve 223, thereby controlling a pressure in the process container 202 to be equal to a predetermined pressure.

The supplied $TiCl_4$ gas is supplied onto the wafer 200. A titanium containing layer is formed as a first-element-containing layer on a surface of the wafer 200 when the $TiCl_4$ gas comes in contact with the surface of the wafer 200.

The titanium containing layer is formed to a predetermined thickness and in a predetermined distribution, based on, for example, the pressure in the process container 202, the flow rate of the $TiCl_4$ gas, the temperature of the wafer 200 and the duration of a treatment performed in the process chamber 201, etc.

After a predetermined time passes, the valve 243d is closed and the supply of the $TiCl_4$ gas is stopped. The valve 245d is kept open and the supply of the inert gas is continuously supplied.

[First Shower Head Exhaust Process (Operation S204)]

After the supply of the $TiCl_4$ gas is stopped, the valve 237 is opened and an atmosphere in the shower head 230 is exhausted. Specifically, an inner atmosphere of the buffer chamber 232 is exhausted. In this case, the vacuum pump 239 is operated beforehand. The first shower head exhaust process (operation S204) will be described in detail below.

In this case, the degree of openness of the valve 237 and the vacuum pump 239 are adjusted such that an exhaust conductance in the buffer chamber 232 using the first exhaust system is higher than the conductance of the exhaust pump 224 via the process chamber 201. Through the adjustment, a gas flow is formed from the center of the buffer chamber 232 toward the shower head exhaust hole 231b. Thus, a gas attached to an inner wall of the buffer chamber 232 or a gas floating in the buffer space may be prevented from flowing into the process chamber 201 and exhausted from the first exhaust system.

[First Process Chamber Exhaust Process (Operation S206)]

After a predetermined time passes, while the exhaust pump 224 of the second exhaust system is operated, the degree of openness of the APC valve 223 and the degree of openness of the valve 237 are adjusted such that an exhaust conductance in the process space using the second exhaust system is higher than an exhaust conductance using the first exhaust system via the shower head 230. Through the adjustment, a gas flow is formed toward the second exhaust system via the process chamber 201. Thus, the inert gas supplied into the buffer chamber 232 may be reliably supplied onto the wafer 200, thereby increasing the efficiency of removing remnant gases on the wafer 200.

An inert gas supplied in the first process chamber exhaust process causes a titanium component that is not combined with the wafer 200 in the first process gas supply process (operation S202) to be removed from the wafer 200. Also, the valve 237 is opened, and the pressure adjustor 238 and the vacuum pump 239 are controlled to remove the $TiCl_4$ gas remaining in the shower head 230. After a predetermined time passes, the valve 237 is closed to disconnect the shower head 230 and the vacuum pump 239 from each other.

More preferably, the valve 237 is closed while the exhaust pump 224 of the second exhaust system is continuously operated after a predetermined time passes. In this case, the flow of a gas passing through the process chamber 201 is not influenced by the first exhaust system and thus an inert gas may be more reliably supplied onto the wafer 200, thereby greatly increasing the efficiency of removing remnant gases from the wafer 200.

Also, the following effects may be obtained when the first process chamber exhaust process (operation S206) is performed after the first shower head exhaust process (operation S204). That is, since a remnant gas is removed from the inside of the buffer chamber 232 in the first shower head exhaust process (operation S204), the remnant gas may be prevented from being attached to the wafer 200 even when a gas passes through the wafer 200 in the first process chamber exhaust process (operation S206).

[Second Process Gas Supply Process (Operation S208)]

After the first process chamber exhaust process, the valve 244d is opened and ammonia gas is supplied into the process chamber 201 via the gas introduction hole 241, the buffer chamber 232 and the plurality of through-holes 234a. Since the ammonia gas is supplied into the process chamber 201 via the buffer chamber 232 and the plurality of through-holes 234a, the ammonia gas may be evenly supplied onto the wafer 200, thereby uniformizing film thickness.

In this case, the MFC 244c is controlled to adjust the flow rate of the ammonia gas to be equal to a predetermined flow rate. A supply flow rate of the ammonia gas is, for example, in a range from 100 sccm to 5,000 sccm. Also, $N_2$ gas may be supplied as a carrier gas through the second inert gas supply system together with the ammonia gas. Also, the pressure in the process container 202 is controlled to be equal to a predetermined pressure by appropriately controlling the degree of openness of the APC valve 223.

The ammonia gas that is in a plasma state is supplied onto the wafer 200. The formed titanium containing layer is modified by the plasma of the ammonia gas to form, for example, a layer containing the element titanium and the element nitrogen on the wafer 200.

The modified layer is formed to have a predetermined thickness and distribution and an invasion depth of a predetermined nitrogen component or the like into the titanium containing layer, based on, for example, the pressure in the process container 202, the flow rate of the ammonia gas, the temperature of the substrate placing table 212, the amount of electric power supplied to the remote plasma unit 244e, etc.

After a predetermined time passes, the valve 244d is closed to stop the supply of the ammonia gas.

[Second Shower Head Exhaust Process (Operation S210)]

After the supply of the ammonia gas is stopped, the valve 237 is opened to exhaust an atmosphere in the shower head 230. Specifically, an inner atmosphere of the buffer chamber 232 is exhausted. In this case, the vacuum pump 239 is operated beforehand. The second shower head exhaust process (operation S210) will be described in detail below.

The degrees of openness of the valve 237 and the vacuum pump 239 are adjusted such that an exhaust conductance in the buffer chamber 232 using the first exhaust system is higher than the conductance of the exhaust pump 224 via the process chamber 201. Through the adjustment, the flow of a gas is formed toward the shower head exhaust hole 231b from the center of the buffer chamber 232. Thus, a gas attached to a wall of the buffer chamber 232 or a gas floating in the buffer space is prevented from flowing into the process chamber 201 and is exhausted via the first exhaust system.

[Second Process Chamber Exhaust Process (Operation S212)]

After a predetermined time passes, while the exhaust pump 224 of the second exhaust system is operated, the degree of openness of the APC valve 223 and the degree of openness of the valve 237 are adjusted such that an exhaust conductance in the process space using the second exhaust system is higher than an exhaust conductance using the first exhaust system via the shower head 230. Through the adjustment, the flow of a gas toward the second exhaust system via the process chamber 201 is formed. Thus an inert gas supplied into the buffer chamber 232 may be reliably supplied onto the wafer 200, thereby increasing the efficiency of removing a remnant gas from the wafer 200.

The inert gas supplied in the first process chamber exhaust process (operation S206) causes an ammonia component that is not combined with the wafer 200 in the second process gas supply process to be removed from the wafer 200. Also, the valve 237 is opened and the pressure adjustor 238 and the vacuum pump 239 are controlled to remove the ammonia gas remaining in the shower head 230. After a predetermined time passes, the valve 237 is closed to disconnect the shower head 230 and the vacuum pump 239 from each other.

More preferably, after the predetermined time passes, the valve 237 is closed while the exhaust pump 224 of the second exhaust system is continuously operated. In this case, the flow of either the remnant gas in the buffer chamber 232 or the supplied inert gas, which passes through the process chamber 201 and flows toward the second exhaust system, is not influenced by the first exhaust system, thereby guaranteeing the supply of the inert gas onto the wafer 200. Accordingly, the efficiency of removing the remnant gas that does not completely react with a first gas from the wafer 200 is greatly increased.

Also, the following effect may be obtained when the second process chamber exhaust process (operation S212) is performed after the second shower head exhaust process (operation S210). That is, since remnants in the buffer chamber 232 are removed in the second shower head exhaust process (operation S210), a remnant gas may be prevented from being attached to the wafer 200 even when a gas passes through the wafer 200 in the second process chamber exhaust process (operation S212).

[Determination Process (Operation S214)]

The controller 260 determines whether one cycle including the processes described above is performed a predetermined number of times.

When it is determined that the cycle is not performed the predetermined number of times ('NO' in operation S214), the cycle including the first process gas supply process (operation S202), the first shower head exhaust process (operation S204), the first process chamber exhaust process (operation S206), the second process gas supply process (operation S208), the second shower head exhaust process (operation S210) and the second process chamber exhaust process (operation S212) is performed again. When it is determined that the cycle is performed the predetermined number of times ('YES' in operation S214), the film forming process (operation S104) ends.

Next, the first shower head exhaust process (operation S204) will be described in detail with reference to FIG. 5. The second shower head exhaust process (operation S210) is substantially the same as the first shower head exhaust process (operation S204) and thus redundant description will be omitted here.

However, since, in the substrate processing apparatus 100 according to the present embodiment, a first gas and a second gas are supplied into the process chamber 201 via the shower head 230, gas reaction occurs in the buffer chamber 232 when even one of the first and second gases remains in the buffer chamber 232. When the gas reaction occurs, a by-product may be generated and attached to a wall of the buffer chamber 232. Substrate characteristics may be badly influenced when the by-product peels off and is then attached to the wafer 200. Thus, the attached by-product or a remnant gas needs to be reliably exhausted.

A region in which a gas remains is in the buffer chamber 232. A region 232a which is an angular space formed between the lid 231 and a flange of the dispersion plate 234 is an example of this region. The region is hardly influenced by the flow of a gas formed in a path from the hole 231a to the shower head exhaust hole 231b via the gas guide 235, and a gas is thus likely to remain in the region. Thus, a gas is more likely to be stagnant in this region than in other regions. Also, as illustrated in FIG. 2, a gap may be generated between structures according to the precision of processing and a gas may thus flow into the gap. Thus, in the buffer chamber 232, gases are likely to remain and react with each other to form a reaction product or by-products. The reaction product, the by-products and the remnant gases may be attached to walls of the region 232a but are not easily removed simply by supplying a purge gas since a gas may remain between the flow of a gas and the attached reaction product, the by-products and the remnant gases. Such attached reaction product, by-products and remnant gases will be referred to hereinafter as 'buffer chamber attachments.'

Accordingly, in the present embodiment, a method of more reliably removing remnant gases or by-products even in a region in which a gas remains will be described. A shower head exhaust process will be described in detail with reference to FIG. 5 below.

[First Exhaust Process (Operation S302)]

After the valve 243d is closed in the first process gas supply process (operation S202) (or in the second shower head exhaust process (operation S210) after the valve 244d is closed in the second process gas supply process (operation S208)), the valve 237 is opened and an inner atmosphere of the buffer chamber 232 is exhausted in a state in which the valve 245d of the third gas supply system is closed. In this case, the degree of openness of the valve 237 is adjusted such that a conductance in the first exhaust system including the valve 237 is higher than a conductance exhausted via the plurality of through-holes 234a.

When the inner atmosphere of the buffer chamber 232 is exhausted as described above, a gas is prevented from flowing to the shower head exhaust hole 231b from the hole 231a, thereby enabling remnant gases to be eliminated from not only the central portion of the buffer chamber 232 but also the region 232a which is an angular space.

In addition, an inert gas may be supplied by opening the valve 245d. In this case, the amount of the inert gas to be supplied is set to be sufficient to eliminate remnant gases from the region 232a.

[Purging Process (Operation S304)]

After a predetermined time passes, an inert gas serving as a purge gas is supplied into the buffer chamber 232 by opening the valve 245d of the third gas supply system while the degree of openness of the valve 237 is maintained constant. Since there are no remnant gases around a wall to which buffer chamber attachments are attached, the supplied inert gas may attack the buffer chamber attachments. The attacked buffer chamber attachments are separated from the wall of the buffer chamber 232. The separated buffer chamber attachments temporarily float in the buffer chamber 232.

In the purging process (operation S304), the degree of openness of the valve 237 is maintained constant such that a conductance of the first exhaust system including the valve 237 is higher than a conductance of the second exhaust system that communicates with the process chamber 201, similar to the first exhaust process (operation S302).

When an inert gas is supplied in the first exhaust process (operation S302), a feed rate of a purge gas via the third gas supply system in the purging process (operation S304) is preferably increased more than in the first exhaust process (operation S302).

[Second Exhaust Process (Operation S306)]

After a predetermined time passes, the valve 245d of the third gas supply system is closed while the degree of openness of the valve 237 is maintained constant. In this case, similar to the first exhaust process (operation S302) and the purging process (operation S304), the degree of openness of the valve 237 is maintained constant such that a conductance of the first exhaust system including the valve 237 is higher than a conductance of the second exhaust system that communicates with the process chamber 201.

In this case, a gas may be prevented from flowing to the shower head exhaust hole 231b from the hole 231a via the gas guide 235, thereby enabling the buffer chamber attachments separated in the purging process (operation S304) to be eliminated from not only the central portion of the buffer chamber 232 but also the region 232a which is an angular space. Also, since the conductance of the first exhaust system is controlled to be higher than that of the second exhaust system, the buffer chamber attachments separated in the purging process (operation S304) may be eliminated while preventing the buffer chamber attachments from dropping onto the wafer 200 in the process chamber 201.

Furthermore, the process throughput may be increased since by-products and remnant gases may be eliminated by simply controlling the degree of closing/opening the valve 245d while the degree of openness of the valve 237 is maintained constant.

After a predetermined time passes, the valve 237 is closed and the valve 245d is opened to perform the first process chamber exhaust process (operation S206) [or the second process chamber exhaust process (operation S212)].

Although the degree of openness of the valve 237 is maintained constant in the first exhaust process (operation S302), the purging process (operation S304) and the second exhaust process (operation S306), embodiments of the present invention are not limited thereto and the degree of openness of the valve 237 may be changed, provided that the conductance of the first exhaust system is maintained to be higher than that of the second exhaust system. Although the throughput may be lower in this case than when the degree of openness of the valve 237 is maintained, exhausting may be controlled based on the properties of a gas or the adhesive properties of a by-product.

Figure 6A:
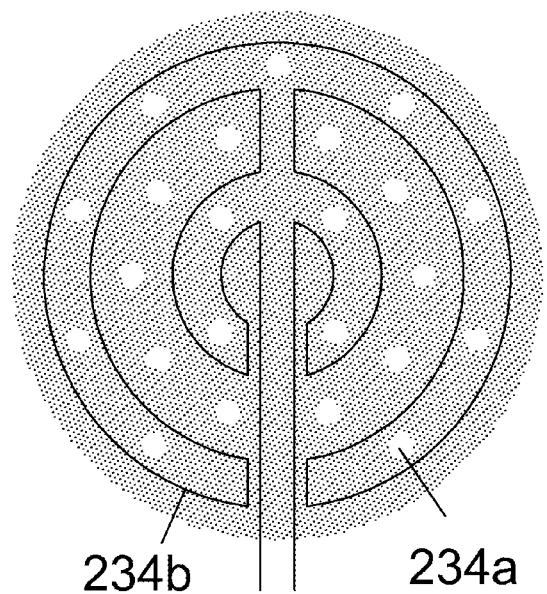
FIGS. 6A through 6C are diagrams illustrating dispersion plate heating units according to embodiments of the present invention.
Figure 6B:
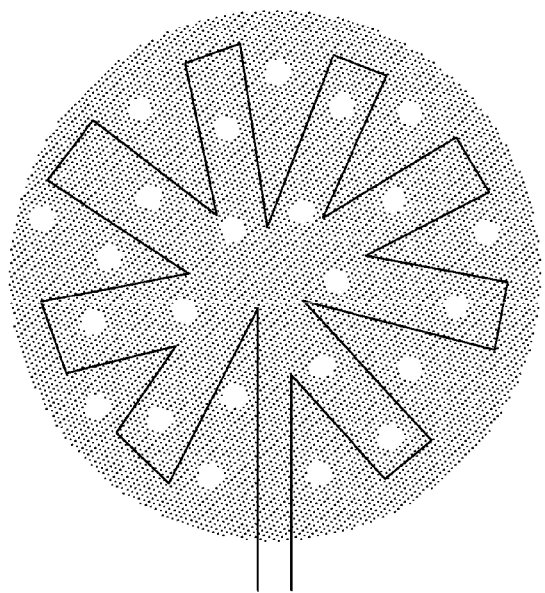
Figure 6C:
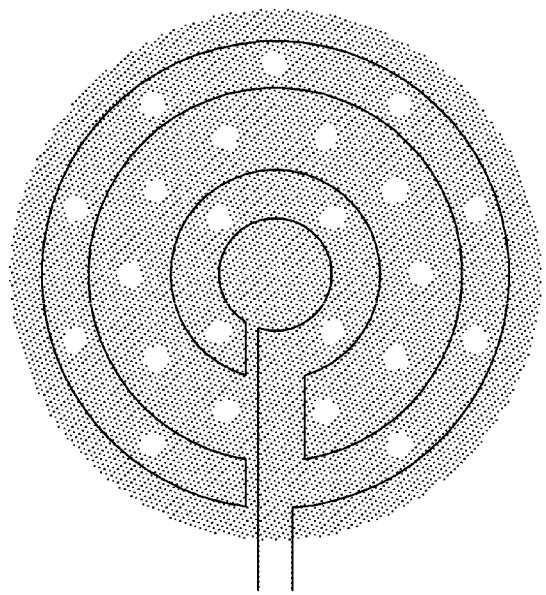

Dispersion plate heating units 234b according to various embodiments of the present invention will now be described with reference to FIGS. 6A through 6C. FIGS. 6A through 6C are diagrams illustrating the shapes or locations of the dispersion plate heating units 234b according to embodiments of the present invention, in which a relation between the locations of the dispersion plate 234, the plurality of through-holes 234a and each of the dispersion plate heating units 234b when the dispersion plate 234 is viewed in a direction of a substrate is illustrated. Each of the dispersion plate heating units 234b is disposed not to be in contact with the plurality of through-holes 234a of the dispersion plate 234.

FIG. 6A illustrates a structure in which dispersion plate heating units 234b are disposed on each of an inner circumference and an outer circumference. Since the dispersion plate heating units 234b are uniformly disposed in a circumferential direction and a direction of the diameter of the dispersion plate 234, the dispersion plate 234 may be uniformly heated by the dispersion plate heating units 234b in the circumferential direction and the direction of the diameter thereof. FIG. 6B illustrates a structure in which a plurality of heater wires are installed toward an outer circumference of the structure from an inner circumference thereof. Thus, the dispersion plate 234 may be uniformly heated in the direction of the diameter thereof. FIG. 6C illustrates a structure in which the dispersion plate heating units 234b are disposed on an inner circumference and an outer circumference, similar to the structure of FIG. 6A. However, the structure of FIG. 6C is different from that of FIG. 6A in that the number of acute folded places is smaller than that in FIG. 6A. That is, the dispersion plate heating units 234b are folded in an obtuse angle shape. Since the number of acute folded places is small, the dispersion plate heating units 234b are prevented from being locally heated due to the portions of the dispersion plate heating units 234b that are folded, thereby more uniformly heating the dispersion plate 234 and the like.

Common gas supply pipes 242 according to various embodiments of the present invention will be described with reference to FIGS. 7A through 7H below. FIGS. 7A through 7H are cross-sectional views of the common gas supply pipes 242. For convenience of explanation, the common gas supply pipe heating unit 242a installed on the outer circumference of the common gas supply pipe 242 is not be described here.

When a gas is heated, the amount Q of heat delivered to the gas from a surface of a solid is proportional to a contact surface area of the gas as shown in Equation 1 below. Thus, in the embodiments of FIGS. 7A through 7G, a gas may be efficiently heated by increasing a surface area of the inner circumference of the common gas supply pipe 242 that is in contact with the gas.

$$Q = Ah(T_w - T_f)$$ [Equation 1]

Q: Amount of heat delivered to gas from wall surface
A: Surface area of wall [m$^2$]
h: transfer rate of heat [W/m$^2$K]
$T_w$: temperature of wall surface [K]
$T_f$: temperature of gas [K]

Figure 7A:
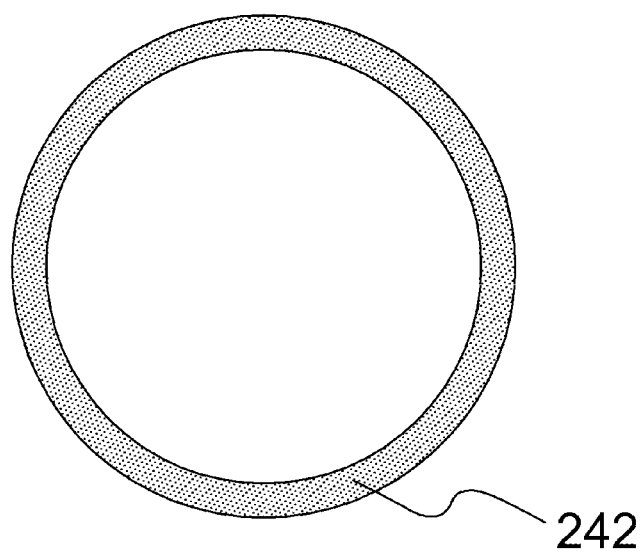
FIGS. 7A through 7H are cross-sectional views of common gas supply pipes according to embodiments of the present invention.
Figure 7B:
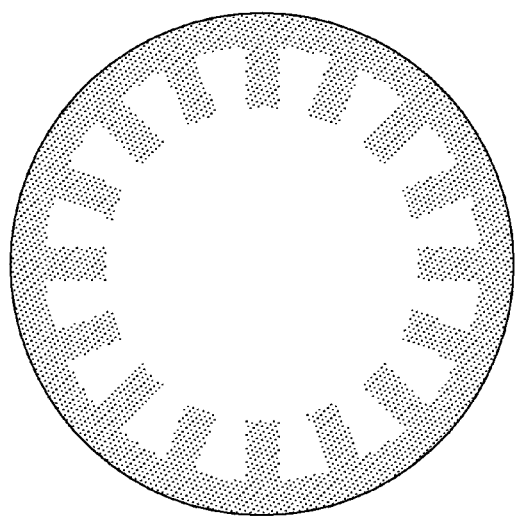
Figure 7C:
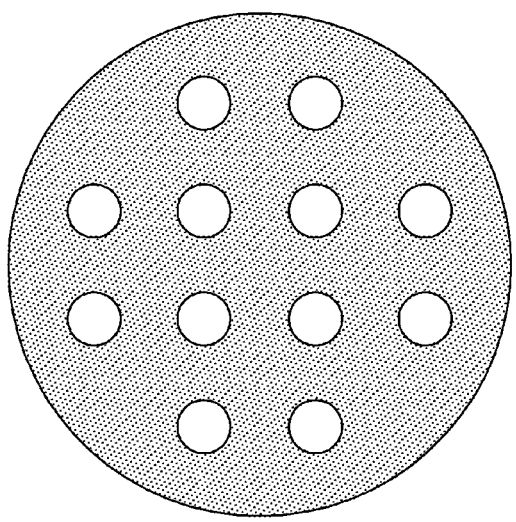
Figure 7D:
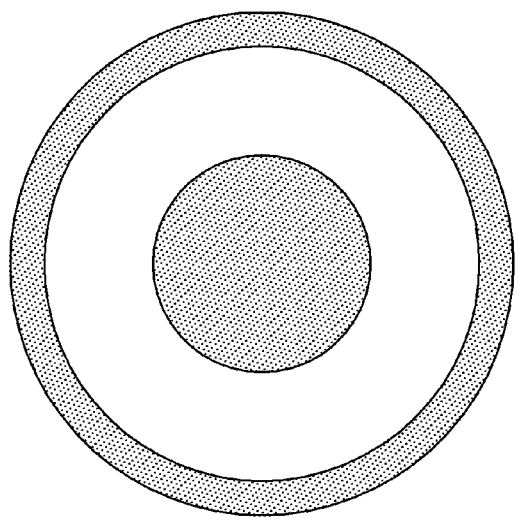
Figure 7E:
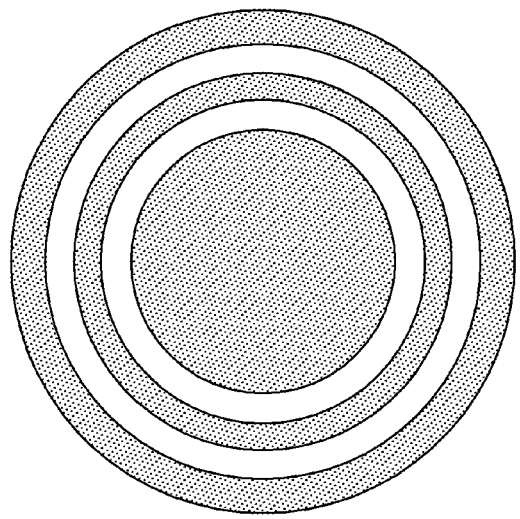
Figure 7F:
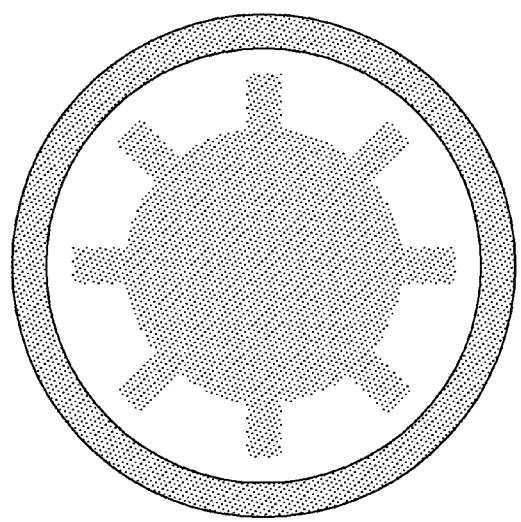
Figure 7G:
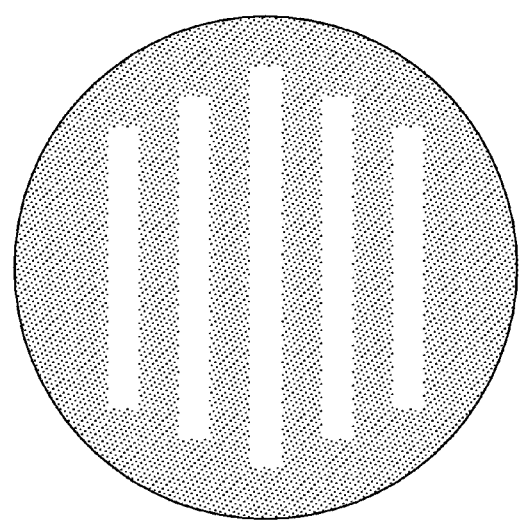
Figure 7H:
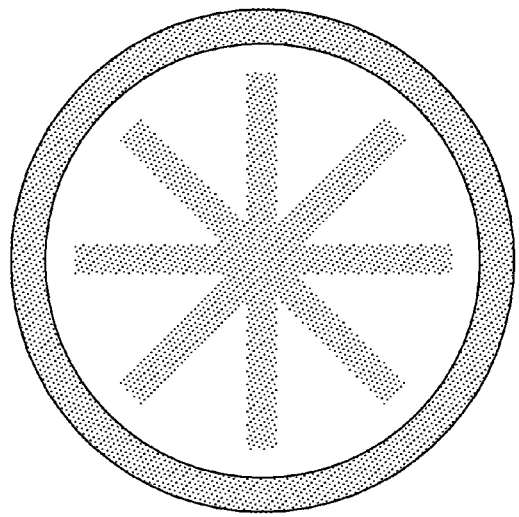

Referring to FIG. 7A, the common gas supply pipe 242 is used as a thermal conduction member. By using the common gas supply pipe 242 as a thermal conduction member, a gas passing through an inner side of the common gas supply pipe 242 may be heated. Referring to FIG. 7B, a plurality of convex portions are formed on an inner side of a common gas supply pipe 242. A gas supplied to the common gas supply pipe 242 comes in contact with the plurality of convex portions. An area of the common gas supply pipe 242 that may be in contact with a gas is large and heat may thus be more efficiently conducted, compared to the common gas supply pipe 242 of FIG. 7A. Referring to FIG. 7C, a dispersion plate is installed perpendicular to the flow of a gas. The dispersion plate is formed such that holes are evenly formed therein and a gas supplied thereto is uniformly heated when the gas passes through the dispersion plate. Referring to FIG. 7D, a heat conduction member is installed at the center of a common gas supply pipe 242. In this case, the common gas supply pipe 242 does not include any element that blocks the flow of a gas, and is capable of supplying a uniformly heated gas without causing the gas to be stagnant since the distance between the heat conduction member and the common gas supply pipe 242 is short. Thus, by-products may be prevented from being generated due to remnants. Referring to FIG. 7E, a second heat conduction member is further installed between a first heat conduction member at the center of a common gas supply pipe 242 and an inner circumference of the common gas supply pipe 242, compared to the structure of FIG. 7D. The common gas supply pipe 242 of FIG. 7E may be more uniformly heated than the common gas supply pipe 242 of FIG. 7D. A common gas supply pipe 242 of FIG. 7F is different from the common gas supply pipe 242 of FIG. 7D in that convex portions are formed on a heat conduction member at the center thereof. Since the heat conduction member at the center of the common gas supply pipe 242 is configured to be detachable, the heat conduction member may be detached from the common gas supply pipe 242 and cleaned even when a gas is attached to the convex portions, thereby enabling the common gas supply pipe 242 to be easily maintained. FIG. 7G illustrates a case in which a plurality of rectangular openings are formed in the common gas supply pipe 242 of FIG. 7C instead of holes. FIG. 7H illustrates a common gas supply pipe 242 in which a convex-shaped heat conduction member is installed at the center thereof, compared to the common gas supply pipe 242 of FIG. 7A.

Gas guides 235 according to various embodiments of the preset invention will be described with reference to FIGS. 8A through 8D below. FIGS. 8A through 8D illustrate gas guides 235 viewed at the dispersion plate 234, in which a hole 231a is formed in the lid 231 to correspond to a center of the gas guides 235. The gas guides 235 are each configured as a structure that may be efficiently heated by increasing a surface area thereof that may be in contact with a gas by forming a protrusion or a groove thereon, similar to the gas supply pipe described above.

Figure 8A:
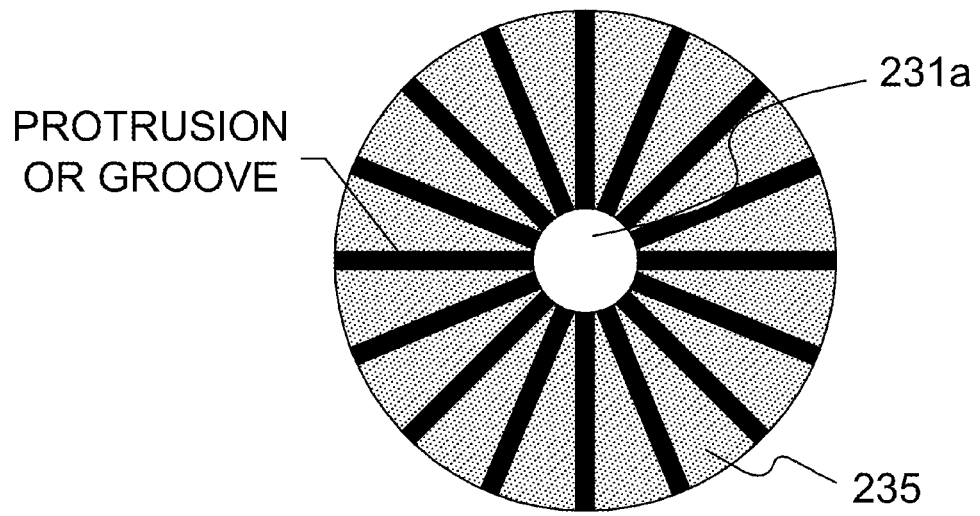
FIGS. 8A through 8D are diagrams illustrating gas guides according to embodiments of the present invention.
Figure 8B:
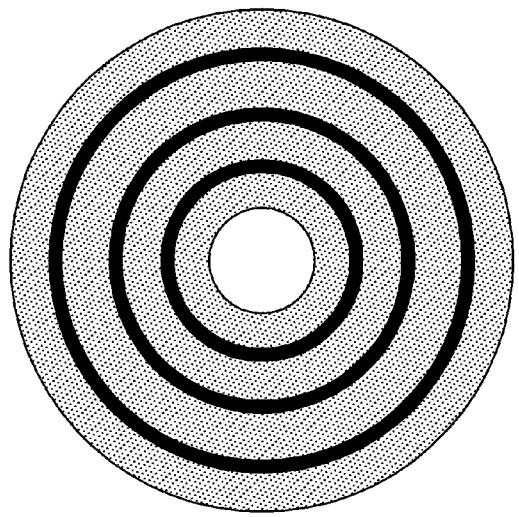
Figure 8C:
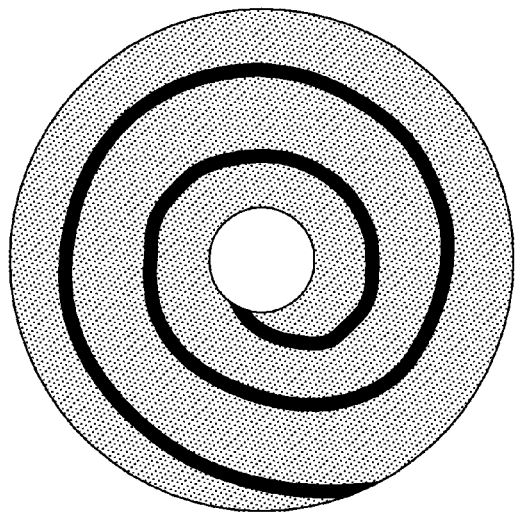
Figure 8D:
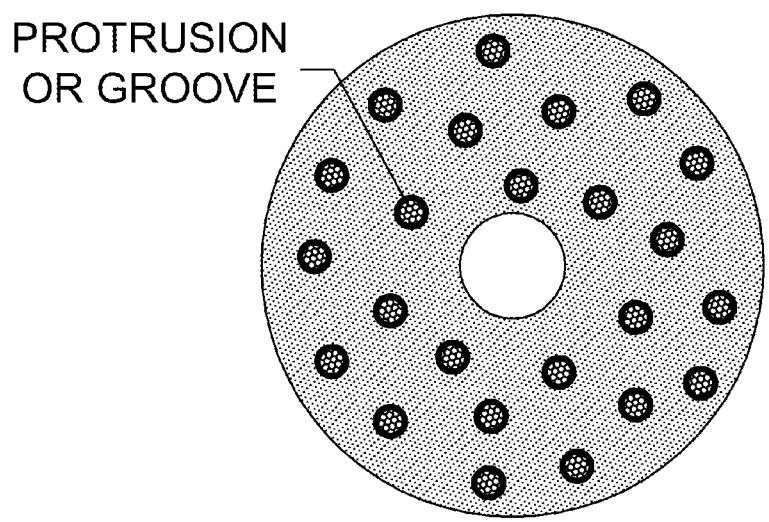

FIG. 8A illustrates the gas guide 235 in which a convex structure is installed in a radial form with the hole 231a as a center. A gas supplied via the hole 231a is heated while in contact with the convex structure. Since the convex structure is in parallel with the flow of the gas, the flow of the gas is thus not blocked by the convex structure. Thus, remnants hardly remain in the gas guide 235, and thus by-products or a reaction inhibitor generated when, for example, a first process gas (e.g., TiCl$_4$) and a second process gas (e.g., NH$_3$) which remain in the gas guide 235 react with each other may be suppressed from being attached to an inner wall of the buffer chamber 232. FIG. 8B illustrates the gas guide 235 in which a plurality of cylindrical convex structures are installed with the hole 231a as a center. A gas flowing along the gas guide 235 is heated while in contact with the cylindrical convex structures. Also, the flow of the gas is formed toward the dispersion plate 234. Thus, a gas supplied into the buffer chamber 232 may be more uniformly heated. FIG. 8C illustrates the gas guide 235 in which a convex structure is formed in a swirl shape with the hole 231a as a center. In the gas guide 235 of FIG. 8C, a gas is heated by the convex structure, similar to the gas guide 235 of FIG. 8B but warm current may be more easily formed due to the convex structure having the swirl shape than the gas guide 235 of FIG. 8B, thereby more uniformly heating a gas supplied into the buffer chamber 232. FIG. 8D illustrates the gas guide 235 in which a convex structure has independent dots. Thus, an area of the gas guide 235 that may be in contact with a gas may be increased to be efficiently heated.

The areas of the gas guides 235 of FIGS. 8A through 8D that may be in contact with a gas supplied thereto are preferably large, and may each have grooves instead of the convex structure.

Although cases in which a titanium nitride film is formed on the wafer 200 using a titanium-containing gas as a first-element-containing gas and a nitrogen-containing gas as a second-element-containing gas have been described above in the previous embodiments, embodiments of the present invention are not limited thereto. For example, a high-k film, such as a hafnium oxide (HfO) film, a zirconium oxide (ZrO) film, or a titanium oxide (TiO) film, may be formed on the wafer 200 using silicon (Si), a hafnium (Hf)-containing gas, a zirconium (Zr)-containing gas, or a titanium (Ti)-containing gas as the first-element-containing gas.

Also, although the first gas, the second gas and the third gas are supplied into the buffer chamber 232 via the common gas supply pipe 242 in the previous embodiments, embodiments of the present invention are not limited thereto. For example, each of gases to be supplied into the buffer chamber 232 may come in contact with the shower head 230.

Also, although the shower head exhaust hole 231b connected to the first exhaust system is installed in the lid 231 of the shower head 230 in the previous embodiments, embodiments of the present invention are not limited thereto and the shower head exhaust hole 231b may be formed in, for example, a side surface of the buffer chamber 232.

(3) Effects of the Present Embodiment

According to the present embodiment, one or more representative effects which will be described below may be achieved.

(a) By setting the temperature of the wafer 200 to be higher than that of the buffer chamber 232, a gas supplied into the buffer chamber 232 may be prevented from being attached onto an inner wall of the buffer chamber 232 while improving the efficiency of heating the gas.

(b) Since remnants may be suppressed from remaining in the buffer chamber 232, an amount of the remnants remaining in the buffer chamber 232 may be reduced.

According to the present invention, a substrate processing apparatus capable of suppressing generation of by-products in a buffer space in even a single-wafer apparatus using a shower head including the buffer space, and a method of manufacturing a semiconductor device are provided.

<Supplementary Notes>

The present invention is defined in the appended claims and includes the following supplementary notes.

(Supplementary Note 1)

According to one aspect of the present invention, there is provided a substrate processing apparatus including:

a process chamber including a placement unit having a placing surface whereon a substrate is placed;

a shower head including a buffer chamber and installed at upstream side of the process chamber;

a gas supply system configured to alternately supply at least two types of gases into the process chamber via the buffer chamber of the shower head; and a heating unit configured to heat the buffer chamber to a first temperature and the process chamber to a second temperature which is higher than the first temperature while the at least two types of gases are supplied via the gas supply system.

(Supplementary Note 2)

In the substrate processing apparatus of Supplementary note 1, the heating unit includes at least a first heating unit embedded in the placement unit and a second heating unit installed at upstream side of the buffer chamber.

(Supplementary Note 3)

In the substrate processing apparatus of Supplementary note 2, the second heating unit is provided on a lid of the shower head.

(Supplementary Note 4)

In the substrate processing apparatus of Supplementary note 2 or 3, the heating unit further includes a third heating unit installed at downstream side of the buffer chamber.

(Supplementary Note 5)

In the substrate processing apparatus of Supplementary note 4, the third heating unit is installed on a dispersion plate of the shower head.

(Supplementary Note 6)

In the substrate processing apparatus of Supplementary note 2 or 3, a temperature of the second heating unit is lower than that of the first heating unit while the at least two types of gases are supplied into the process chamber.

(Supplementary Note 7)

In the substrate processing apparatus of one of Supplementary notes 1 to 6, a common gas supply pipe is connected to the shower head, the at least two types of gases include a first gas and a second gas, and a first gas supply system configured to supply the first gas and a second gas supply system configured to supply the second gas are connected to the common gas supply pipe.

(Supplementary Note 8)

In the substrate processing apparatus of one of Supplementary notes 2 to 7, the second heating unit heats an inner atmosphere of the buffer chamber to a temperature equal to or higher than a temperature whereat by-products of one of the at least two types of gases are attached, to a temperature less than a pyrolyzing temperature of the at least two types of gases or to a temperature less than a reaction temperature whereat the at least two types of gases react with each other to form a film.

(Supplementary Note 9)

In the substrate processing apparatus of Supplementary note 4 or 5, the first heating unit and the third heating unit heat an inner atmosphere of the process chamber to a temperature equal to or higher than a pyrolyzing temperature of the at least two types of gases.

(Supplementary Note 10)

In the substrate processing apparatus of Supplementary note 4 or 5, the third heating unit includes a heating surface parallel to a surface of the substrate placed on the placement unit.

(Supplementary note 11)

In the substrate processing apparatus of Supplementary note 7, a fourth heating unit is installed on an outer circumference of the common gas supply pipe, and a convex structure is installed on an inner circumference of the common gas supply pipe.

(Supplementary Note 12)

In the substrate processing apparatus of Supplementary note 6, the third heating unit is disposed on a location that does not overlap with a dispersion hole formed in a dispersion plate of the shower head.

(Supplementary Note 13)

In the substrate processing apparatus of one of Supplementary notes 1 to 12, the shower head further includes a gas guide formed consecutively from a ceiling portion, wherein the gas guide has a convex structure.

(Supplementary Note 14)

According to another aspect of the present invention, there is provided a method of manufacturing a semiconductor device including:

placing a substrate on a placing surface of a placement unit accommodated in a process chamber; and forming a film on the substrate by alternately supplying at least two types of gases into the process chamber via a shower head while heating a buffer chamber of the shower head to a first temperature and the process chamber to a second temperature which is higher than the first temperature.

(Supplementary note 15)

According to another aspect of the present invention, there is provided a control program to perform:

placing a substrate on a placing surface of a placement unit accommodated in a process chamber; and forming a film on the substrate by alternately supplying at least two types of gases into the process chamber via a shower head while heating a buffer chamber of the shower head to a first temperature and the process chamber to a second temperature which is higher than the first temperature.

(Supplementary Note 16)

According to another aspect of the present invention, there is provided a non-transitory computer readable recording medium storing a control program to perform:

placing a substrate on a placing surface of a placement unit accommodated in a process chamber; and forming a film on the substrate by alternately supplying at least two types of gases into the process chamber via a shower head while heating a buffer chamber of the shower head to a first temperature and the process chamber to a second temperature which is higher than the first temperature.

What is claimed is:

1. A substrate processing apparatus comprising:
   a process chamber including a placement unit having a placing surface whereon a substrate is placed;
   a shower head including a buffer chamber and installed upstream side of the process chamber;
   a gas supply system configured to alternately supply at least two types of gases into the process chamber via the buffer chamber of the shower head; and
   a heating unit configured to heat the buffer chamber to a first temperature and the process chamber to a second temperature which is higher than the first temperature while the at least two types of gases are supplied via the gas supply system, wherein the heating unit comprises at least a first heating unit embedded in the placement unit and a second heating unit installed upstream side of the buffer chamber, and a temperature of the second heating unit is lower than that of the first heating unit while the at least two types of gases are supplied into the process chamber.

2. The substrate processing apparatus of claim 1, wherein the second heating unit is provided on a lid of the shower head.

3. The substrate processing apparatus of claim 1, wherein the heating unit further comprises a third heating unit installed at downstream side of the buffer chamber.

4. The substrate processing apparatus of claim 2, wherein the heating unit further comprises a third heating unit installed at downstream side of the buffer chamber.

5. The substrate processing apparatus of claim 3, wherein the third heating unit is installed on a dispersion plate of the shower head.

6. The substrate processing apparatus of claim 4, wherein the third heating unit is installed on a dispersion plate of the shower head.

7. The substrate processing apparatus of claim 1, wherein the second heating unit heats an inner atmosphere of the buffer chamber to a temperature equal to or higher than a temperature where by-products of one of the at least two types of gases are attached, to a temperature less than a pyrolyzing temperature of the at least two types of gases or to a temperature less than a reaction temperature where the at least two types of gases react with each other to form a film.

8. The substrate processing apparatus of claim 2, wherein the second heating unit heats an inner atmosphere of the buffer chamber to a temperature equal to or higher than a temperature whereat by-products of one of the at least two types of gases are attached, to a temperature less than a pyrolyzing temperature of the at least two types of gases or to a temperature less than a reaction temperature whereat the at least two types of gases react with each other to form a film.

9. The substrate processing apparatus of claim 4, wherein the first heating unit and the third heating unit heat an inner atmosphere of the process chamber to a temperature equal to or higher than a pyrolyzing temperature of the at least two types of gases.

10. The substrate processing apparatus of claim 5, wherein the first heating unit and the third heating unit heat an inner atmosphere of the process chamber to a temperature equal to or higher than a pyrolyzing temperature of the at least two types of gases.

11. The substrate processing apparatus of claim 3, wherein the third heating unit comprises a heating surface parallel to a surface of the substrate placed on the placement unit.

12. The substrate processing apparatus of claim 4, wherein the third heating unit comprises a heating surface parallel to a surface of the substrate placed on the placement unit.

13. The substrate processing apparatus of claim 1, wherein a common gas supply pipe is connected to the shower head,
   the at least two types of gases comprise a first gas and a second gas, and
   a first gas supply system configured to supply the first gas and a second gas supply system configured to supply the second gas are connected to the common gas supply pipe.

14. The substrate processing apparatus of claim 2, wherein a common gas supply pipe is connected to the shower head,
   the at least two types of gases comprise a first gas and a second gas, and
   a first gas supply system configured to supply the first gas and a second gas supply system configured to supply the second gas are connected to the common gas supply pipe.

15. A method of manufacturing a semiconductor device, comprising:
   placing a substrate on a placing surface of a placement unit accommodated in a process chamber; and
   forming a film on the substrate by alternately supplying at least two types of gases into the process chamber via a shower head while heating a buffer chamber of the shower head to a first temperature and the process chamber to a second temperature which is higher than the first temperature using a heating unit comprising at least a first heating unit embedded in the placement unit and a second heating unit installed upstream side of the buffer chamber.

16. A non-transitory computer readable recording medium storing a control program to perform:
   placing a substrate on a placing surface of a placement unit accommodated in a process chamber; and
   forming a film on the substrate by alternately supplying at least two types of gases into the process chamber via a shower head while heating a buffer chamber of the shower head to a first temperature and the process chamber to a second temperature which is higher than the first temperature using a heating unit comprising at least a first heating unit embedded in the placement unit and a second heating unit installed upstream side of the buffer chamber.

* * * * *